(12) United States Patent
Wu et al.

(10) Patent No.: US 8,225,237 B2
(45) Date of Patent: Jul. 17, 2012

(54) METHOD TO DETERMINE PROCESS WINDOW

(75) Inventors: Te-Hung Wu, Tainan County (TW);
Sheng-Yuan Huang, Yun-Lin County (TW); Cheng-Te Wang, Hsinchu County (TW); Chia-Wei Huang, Kao-Hsiung (TW); Ping-I Hsieh, Tainan County (TW); Po-I Lee, Kaohsiung County (TW); Chuen Huei Yang, Taipei (TW); Pei-Ru Tsai, Tainan County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 347 days.

(21) Appl. No.: 12/324,858

(22) Filed: Nov. 27, 2008

(65) Prior Publication Data

US 2010/0131914 A1    May 27, 2010

(51) Int. Cl.
*G06F 17/50* (2006.01)
(52) U.S. Cl. .............. 716/50; 716/53; 716/54; 716/55
(58) Field of Classification Search ............. 716/50
See application file for complete search history.

(56) References Cited

U.S. PATENT DOCUMENTS

| | | | |
|---|---|---|---|
| 6,114,071 A * | 9/2000 | Chen et al. | 430/5 |
| 7,026,175 B2 * | 4/2006 | Li et al. | 438/14 |
| 7,341,955 B2 * | 3/2008 | Nam | 438/709 |
| 7,386,829 B2 | 6/2008 | Lee | |
| 2004/0006758 A1 * | 1/2004 | Aoki | 716/19 |
| 2005/0022151 A1 * | 1/2005 | Rittman et al. | 716/19 |
| 2008/0063948 A1 * | 3/2008 | O'Brien | 430/5 |
| 2008/0270969 A1 * | 10/2008 | Wu et al. | 716/19 |
| 2009/0300576 A1 * | 12/2009 | Huang et al. | 716/21 |

OTHER PUBLICATIONS

Rathore, Hazara Singh, "Via Resistance as a Technique to Control the Electromigration of Non-Overlap Via Holes", Mar. 1982, Reliability Physics Symposium, 1982. 20th Annual , pp. 77-80.*

* cited by examiner

*Primary Examiner* — Paul Dinh
*Assistant Examiner* — Bryce Aisaka
(74) *Attorney, Agent, or Firm* — Winston Hsu; Scott Margo

(57) ABSTRACT

A method to determine a process window is disclosed. First, a pattern data is provided. Second, a bias set is determined. Then, a resizing procedure is performed on the pattern data in accordance with the bias set to obtain a usable final resized pattern to be a target pattern of changed area. The final resized pattern is consistent with a minimum spacing rule, a contact to poly rule and a contact to metal rule. Accordingly, the target pattern is output.

17 Claims, 6 Drawing Sheets

METHOD TO DETERMINE PROCESS WINDOW

BACKGROUND OF THE INVENTION

1. Field of the Invention

The present invention relates to a method to determine a process window. More particularly, the present invention relates to a method to determine a process window so that the members in each polygon of some given pattern data are moved outward as much as possible to have the maximum proper area which meets the minimum spacing rule, too.

2. Description of the Prior Art

Critical technologies such as the photolithography and etching technologies are frequently used in semiconductor manufacturing processes. The photolithography technology usually involves transferring a complicated integrated circuit pattern to a semiconductor wafer surface one by one for individual steps such as etching and implantation. These patterns must be extremely accurate for forming delicate integrated circuits so as to align with the transferred patterns of the previous and following steps.

In the photolithographic step, various deviations often occur and jeopardize the performance of the semiconductor device when the patterns on the reticles are transferred onto the wafer surface. Such deviations are usually related with the characters of the patterns to be transferred, density, the topology of the wafer, the source of the light and various process parameters.

There are many known verification methods, correction methods and compensation methods for the deviations caused by the optical proximity effect, process rules (PRC) and lithography rules (LRC) to improve the image quality after transfer. Some of the known methods are called optical proximity correction (OPC), design rule check (DRC) and lithography rule check (LRC). Many commercially available OPC software products may test problems such as pitch, bridge, and critical dimension uniformity in the layout patterns. Such software may correct the standard layout patterns on the reticles using the theoretical image, so as to obtain correctly exposed image patterns on the wafers. Such methods not only test problems in the layout patterns but also correct the layout patterns on the reticles using the theoretical image. If the corrected image patterns are useable, they are output for the fabrication of reticles to obtain the correct image patterns on the wafer.

Generally speaking, there are well-established stand operational procedures available for the reference of the above-mentioned verification, correction and compensation methods. For example, the conventional procedure using optical proximity correction to verify the layout patterns on a reticle may be first inputting a layout pattern. Then the Boolean pre-treatment of OPC is performed on the layout pattern to obtain a preliminary layout pattern. Afterwards the OPC is performed to correct any particular pattern. Later, the design rule check (DRC) and the lithography rule check (LRC) are separately performed. Then the error screening and check is performed. If the obtained patterns are correct and usable, the patterns are output. If incorrect, the pattern correction is performed again and the patterns are output if no error is found.

However, the above-mentioned verification, correction and compensation methods are based on the concept to correct the distortion of the images caused by the optical proximity effect in stead of substantially changing the actual area size of the layout patterns. Accordingly, the layout patterns which have gone through the optical proximity correction would have no substantial change in actual area size.

Nevertheless, some specific elements, such as contact holes or metal interconnection, have specific characteristics that the larger the area is, the smaller the electric resistance and the better the operational performance of the elements are. To these particular elements which prefer larger area as much as possible, i.e. contact holes or metal interconnection, the optical proximity correction merely avoids the distortion of the images caused by the optical proximity effect in stead of positively assisting the elements to be more operationally efficient. Hence, the operational change by the optical proximity correction has nothing to do with the enhancement of the performance of the elements which prefer larger area size.

In view of the above, another resizing method which is substantially different from the principles and from the procedures of the operation of the conventional optical proximity correction is needed to make the layout patterns which have undergone the methods have the maximum proper area size to determine a better process window.

SUMMARY OF THE INVENTION

The present invention proposes a method to determine a process window. After having undergone this method, some specific patterns in layout patterns are moved outward as much as possible to obtain a maximum proper area size. Because for some specific elements, the larger the area is, the smaller the electric resistance and the better the operational performance of the elements may be, the elements would obtain substantial benefits on their operational performance after the adjustment of the method of the present invention.

A method to determine a process window is proposed. First, pattern data are provided. The pattern data may include various polygons which individually include multiple members and have a first area. Each polygon has a first area. Second, a bias set is determined. The bias set is composed of a series of decreasing bias. Then, at least one resizing procedure is performed on the pattern data in accordance with the bias set to obtain a usable final resized pattern to be a target pattern of changed area. In the resizing procedure, all members first undergo a sizing-down procedure in accordance with a minimum spacing rule, then all members which are not sized down undergo a sizing-up procedure till all of them pass a minimum spacing rule, a contact to poly rule and a contact to metal rule test. The sizing values are in accordance with a series of decreasing values all the way down to 0 in the bias set and a proper sizing value is kept. If a second area of the polygons which undergo the sizing-down procedure is not less than the first area, the resizing procedure is carried out to obtain a target pattern of changed area. If a second area of the polygons which undergo the sizing-down procedure is less than the first area, all members of the polygons abandon their bias. Accordingly, the target pattern is output.

These and other objectives of the present invention will no doubt become obvious to those of ordinary skill in the art after reading the following detailed description of the preferred embodiment that is illustrated in the various figures and drawings.

DETAILED DESCRIPTION

The present invention proposes a method to determine a process window. In particular, the present invention proposes a method to increase a process window in a region of high pattern density. After layout patterns are adjusted by the method of the present invention, some specific patterns, such as contact holes or metal interconnection, are moved outward as much as possible to obtain a maximum proper area size. Because for some specific elements, a larger area stands for a smaller electric resistance and a better operational performance of the elements, the method of the present invention in one aspect determines the process window, and further in another aspect, the elements would obtain some substantial benefits on their operational performance.

Figure 1:
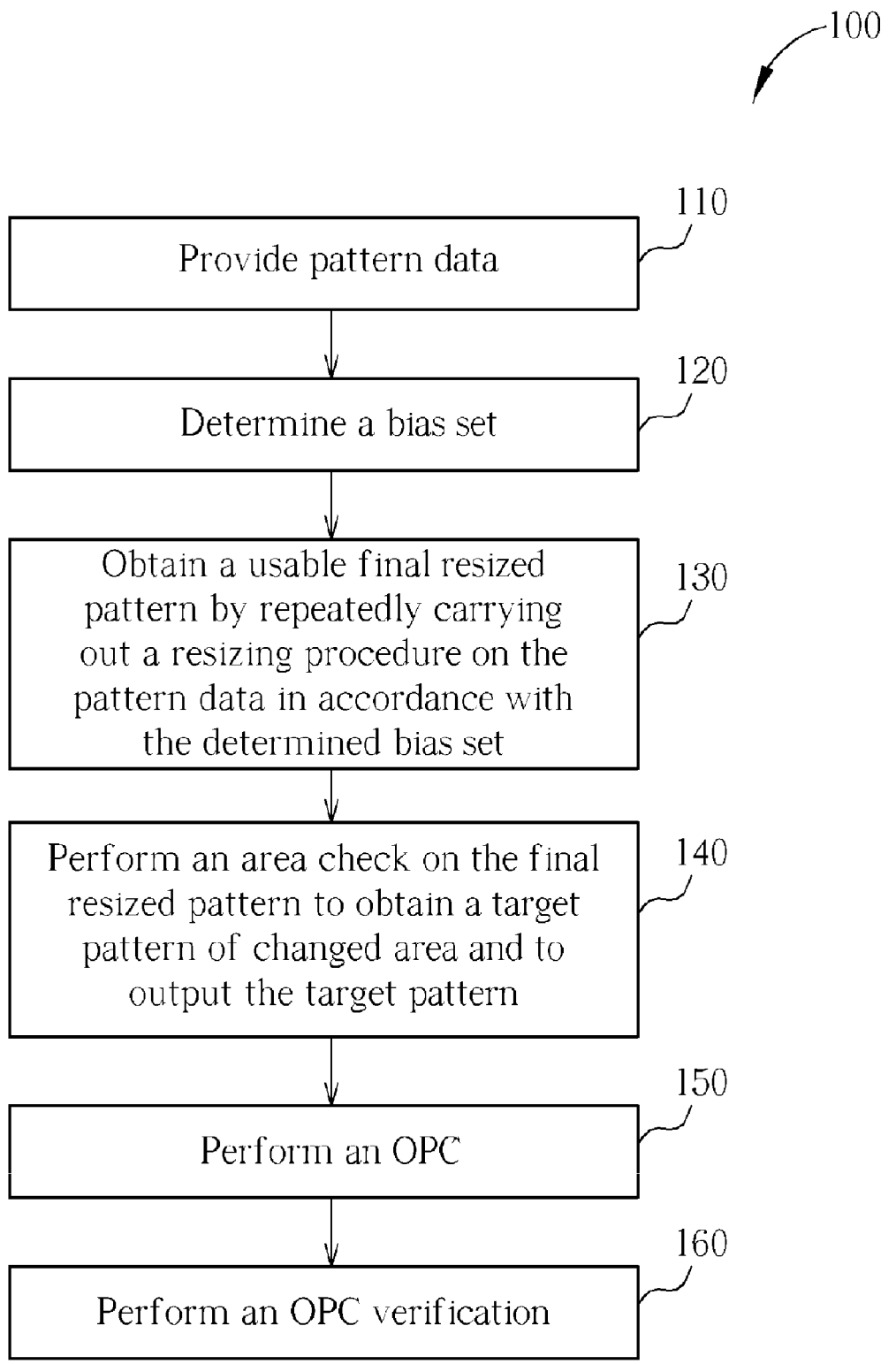
FIG. 1 illustrates a flow chart of the main flow of the method to determine a process window of the present invention.

FIG. 1 illustrates a flow chart of the main flow of the method to determine a process window of the present invention. The method 100 to determine a process window of the present invention includes the steps of:

Step 110: provide pattern data;

Step 120: determine a bias set;

Step 130: obtain a usable final resized pattern by repeatedly carrying out a resizing procedure on the pattern data in accordance with the determined bias set;

Step 140: perform an area check on the final resized pattern to obtain a target pattern of changed area and to output the target pattern;

Step 150: perform an OPC;

Step 160: perform an OPC verification.

First, in Step 110 the pattern data may be a circuit pattern that needs transferring, for example, contact hole pattern data or metal wire pattern data. The feature of the pattern data resides in that the larger the area is, the better the operational performance of the elements is, such as the layout patterns of any stage in a random access memory of contact hole patterns or metal wire patterns. In the pattern data there are polygons which correspond to the elements. The shape of the polygons may be rectangular or the combination thereof. Usually, there are two or more polygons in the pattern data. Each polygon includes multiple members, or in other words, the edges of the polygon. Each polygon has a first area formed by the combination of its multiple members. The first area is the original area of the polygon before the resizing procedure.

Figure 2:
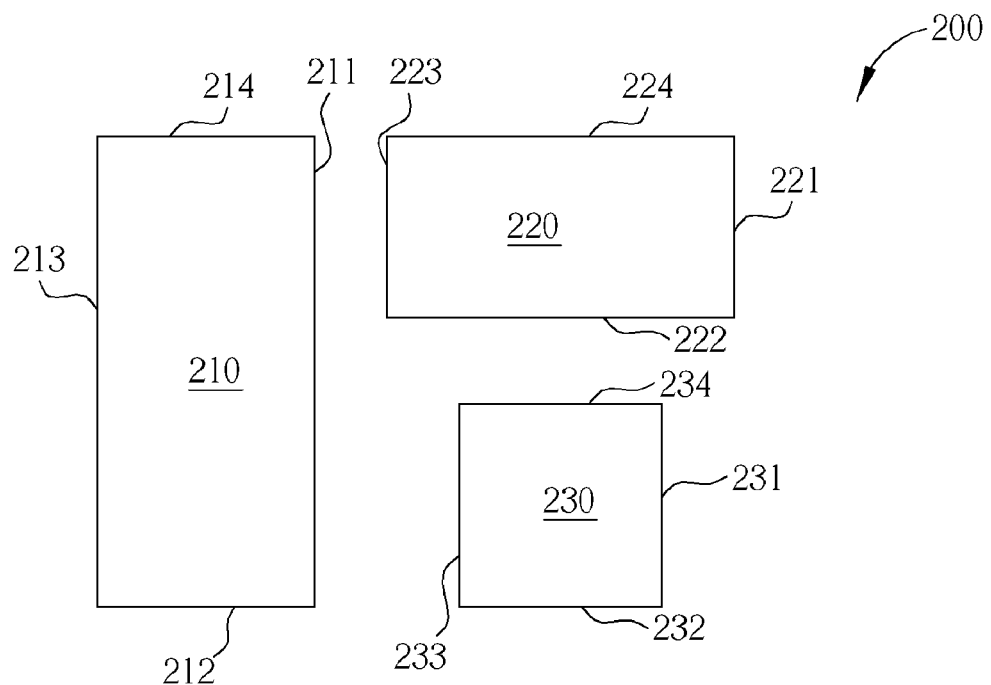
FIG. 2 illustrates given pattern data with layout patterns including polygons, members, and edges.

The following is an embodiment to illustrate the relationship among elements, layout patterns, polygons, members, edges and area sizes in given pattern data with multiple layout patterns. Please refer to FIG. 2, which illustrates given pattern data with layout patterns including polygons, members, and edges. For example, in the pattern data 200, there are optional layout pattern 210, layout pattern 220 and layout pattern 230. The layout patterns 210, 220 and 230 correspond to three adjacent elements but are not limited to this. Each layout pattern 210, 220 and 230 is a polygon, and each polygon 210, 220 and 230 is composed of multiple members, i.e. multiple edges. Edges 211, 212, 213, 214 considered as the members 211, 212, 213, 214 form the polygon 210. Similarly, edges 221, 222, 223, 224 considered as the members 221, 222, 223, 224 form the polygon 220 and edges 231, 232, 233, 234 considered as the members 231, 232, 233, 234 form the polygon 230. Each member may be regarded as the smallest operational unit under the operation of the method to determine a process window of the present invention.

Second, in Step 120, the present invention in the beginning determines an optional bias set. The optional bias set is a collective of the operational parameters for use in the method to determine a process window of the present invention. In a preferred embodiment, the bias set is composed of a series of decreasing bias. Each bias may be several times larger than a pre-determined unit value, or several times larger than the minimum value in the bias set, which is according to the simulated result from a software. The unit value may be the unit value used in the conventional processing techniques, such as "nanometer", or unit values in the metric system or other unit values in non-metric system. Hypothetically speaking, in one embodiment, the bias set is compose of a series of decreasing values, they are 5 nm, 4 nm, 3 nm, 2 nm, 1 nm and 0 for example. In other words, the components of the bias set are 5 nm, 4 nm, 3 nm, 2 nm, 1 nm and 0.

Of course, the bias can not be unlimitedly large. The better range of the bias set may be simulated by software. For example, assume an original polygon of 70 nm by 70 nm dimension. If the simulated result by software is 90 nm by 90 nm, the Max bias is 20 nm.

After the bias set is determined, the method of the present invention goes to

Step 130: obtain a usable pattern, called the final resized pattern, by repeatedly carrying out a resizing procedure on the pattern data in accordance with the determined bias sequentially till a useable pattern is obtained, called a final resized pattern. Because the final resized pattern is accomplished by carrying out at least one resizing procedure on the pattern data and the resizing procedure enlarges each layout pattern as much as possible in accordance with the sequential bias, each layout pattern in the pattern data is therefore moved outward as much as possible to acquire a dimensional gain.

During the resizing procedure, all members first undergo a sizing-down procedure in accordance with a minimum spacing rule so that some weak points which do not meet the minimum spacing rule may increase the space and temporarily meet the minimum spacing rule due to the sizing-down procedure to avoid pitch or bridge in advance. All members which are sized down are not going to undergo a following sizing-up procedure. Only members which are not sized down are going to undergo the following sizing-up procedure.

During the sizing-up procedure, all members which are not sized down are sequentially moved outward according to the bias in the determined bias set decreasingly. The first patterns after the first resizing procedure are called the first sized-up patterns, the second patterns after the second resizing procedure are called the second sized-up patterns, the third patterns after the third resizing procedure are called the third sized-up patterns . . . et cetera. After each resizing procedure is completed, each one of all members in the current sized-up patterns is individually tested in accordance with a minimum spacing rule, a contact to poly rule and a contact to metal rule to see if each one of them is qualified in order to verify the current sized-up patterns are usable. The contact to poly rule stands for "the corresponding rules between the following contact plugs and the previous polysilicon gates" and the contact to metal rule stands for "the corresponding rules between the following metal wires and the previous contact plugs". Supposing each one of all members in the current sized-up patterns is decided to be qualified, the current sized-up patterns are therefore decided to be usable and the following resizing procedure is ceased. A group of final resized patterns are thus obtained.

The following example illustrates a process to carry out one resizing procedure on the pattern data from a design house in accordance with the determined bias set. Please refer to FIG. 3, which illustrates an example of performing one resizing procedure on the pattern data in accordance with the bias set in FIG. 2. All of the members 211, 212, 213, 214, 221, 222, 223, 224, 231, 232, 233, 234 of each one of the layout pattern 210, 220 and 230 are going to be moved outward according to the maximum value (5 nm) of the previously determined bias set (5 nm, 4 nm, 3 nm, 2 nm, and 1 nm) and first sized-up patterns are obtained. Before being moved outward, the layout pattern 210, 220 and 230 have an original area size A, B and C, respectively. During the members being moved outward, assistant features may be introduced into the patterns to facilitate the operation of the resizing procedure.

Figure 3:
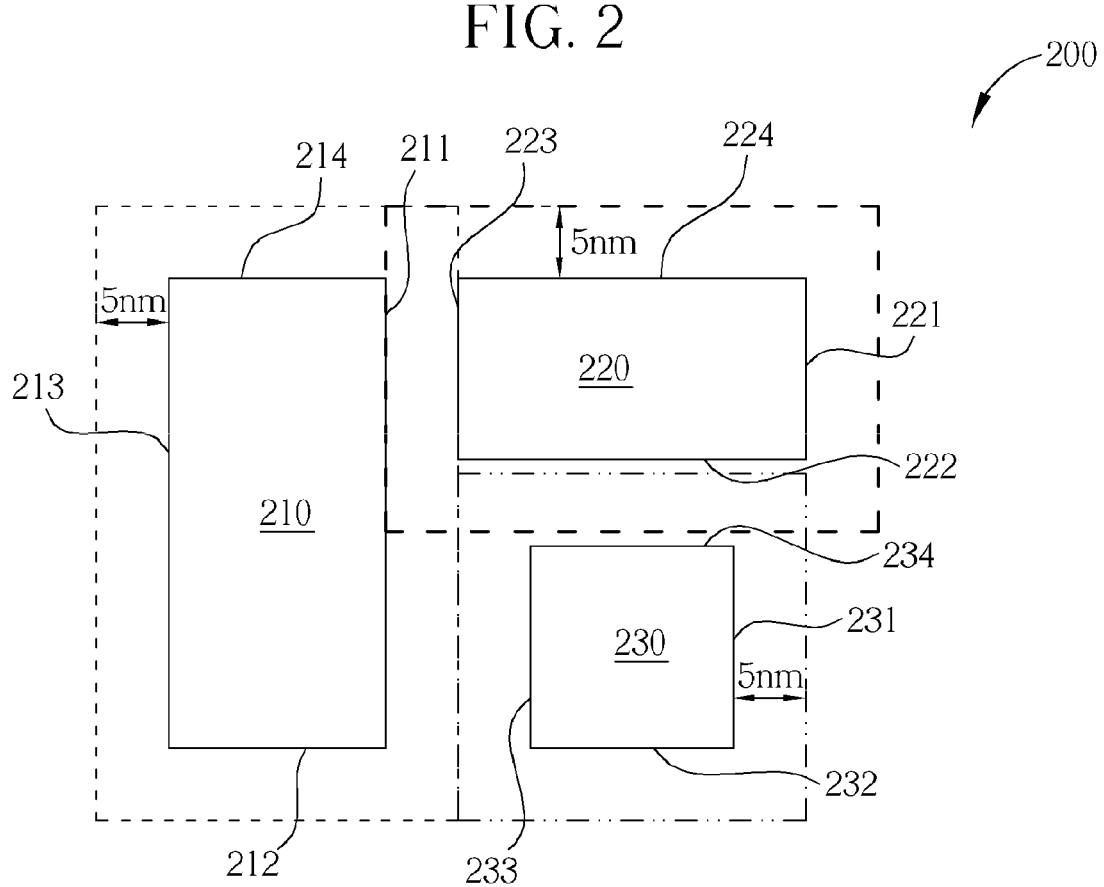
FIG. 3 illustrates an example of performing one resizing procedure on the pattern data in accordance with the bias set in FIG. 2.

Assume in FIG. 3 members 212, 213, 214, 221, 224, 231, 232 pass a check of a minimum spacing rule, a contact to poly rule and a contact to metal rule under this sizing-up procedure, so members 212, 213, 214, 221, 224, 231, 232 are decided to undergo this sizing-up procedure of 5 nm. In the meantime, all of the members 212, 213, 214, 221, 224, 231, 232 which pass the test will keep this current value (5 nm) and do not undergo any further sizing-up procedure.

On the other hand, under this sizing-up procedure of 5 nm, because members 211, 222, 223, 233, 234 in fact fail to pass at least one of a minimum spacing rule, a contact to poly rule and a contact to metal rule and pitch, bridge or blind window may happen, members 211, 222, 223, 233, 234 are decided to be "disqualified". In addition to not being allowed to undergo this sizing-up procedure of 5 nm, these members are decided to return to their original status. At the same time, because at lease one of the all members 211, 212, 213, 214, 221, 222, 223, 224, 231, 232, 233, 234 do not pass the test, the members which do not pass the test, i.e. member 211, 222, 223, 233, 234 now become the disqualified members and are ready for a next round of sizing-up procedure.

It is possible that in a single sizing-up procedure all of the members readily pass the sizing-up operation. In the meantime, besides all of the members which pass the sizing-up operation keep the current bias, the current sized-up patterns are considered to be "usable". The usable sized-up patterns become so-called final sized-up patterns and are ready to go to the following Step 140.

The following example continues to illustrate another process to carry out another round of resizing procedure on the pattern data in accordance with the bias set. Please refer to FIG. 4, which illustrates an example of performing another resizing procedure on the pattern data in accordance with the bias set in FIG. 3. The differences in the operation of FIG. 4 reside in that merely the disqualified members in the last round operation undergo the current resizing procedure because all of the members 212, 213, 214, 221, 224, 231, 232 which had passed the previous test have kept the bias (5 nm) and do not undergo any further sizing-up procedure.

Because the maximum value (5 nm) in the bias set (5 nm, 4 nm, 3 nm, 2 nm, and 1 nm, 0) has been employed, the next largest value is chosen. All of the disqualified members 211, 222, 223, 233, 234 in the layout pattern 210, 220 and 230 are going to be moved outward again according to the next largest value (4 nm) of the bias set (5 nm, 4 nm, 3 nm, 2 nm, and 1 nm). Similarly, during the disqualified members being moved outward, assistant features may be formed in the patterns to facilitate the current operation of the resizing procedure.

Figure 4:
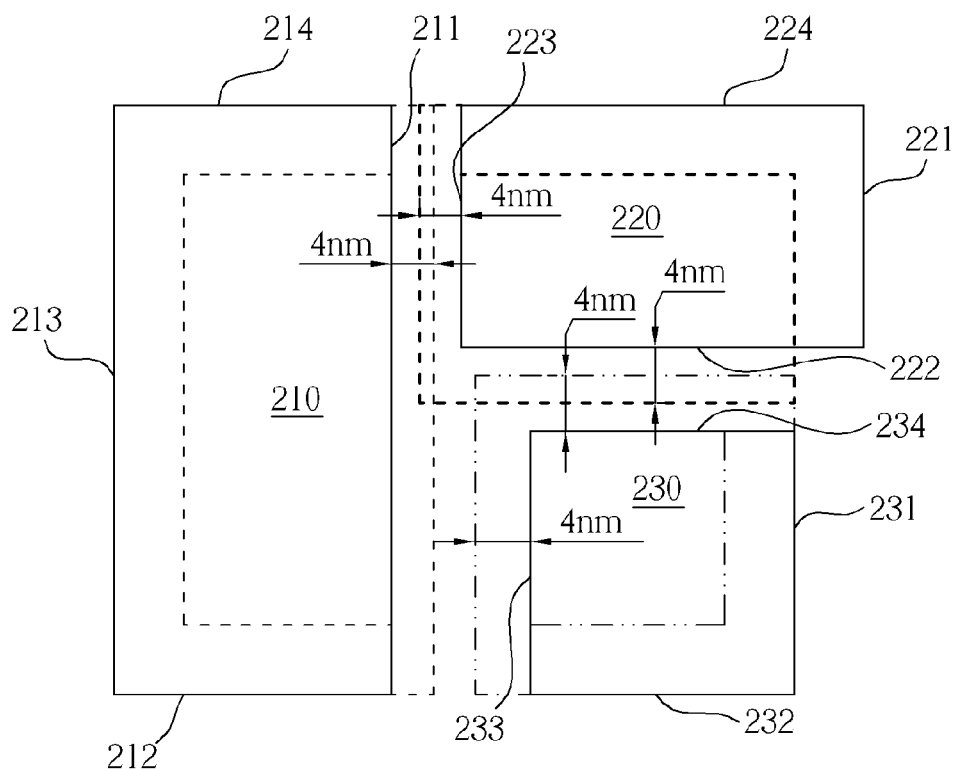
FIG. 4 illustrates an example of performing another resizing procedure on the pattern data in accordance with the bias set in FIG. 3.

Again assume in FIG. 4, only the member 233 pass a check of the minimum spacing rule, the contact to poly rule and the contact to metal rule under this sizing-up procedure, the member 233 is consequently decided to undergo this sizing-up procedure of 4 nm. In the meantime, all of the members which pass the test, i.e. the member 233 will keep this current value (4 nm) and do not undergo any further sizing-up procedure.

On the other hand, as shown in FIG. 4, under this sizing-up procedure of 4 nm, the members 211, 222, 223 and 234 still fail to pass at least one of the minimum spacing rule, the contact to poly rule and the contact to metal rule and pitch, bridge or blind window may happen, the members 211, 222, 223 and 234 are again decided to be "disqualified". In addition to not being allowed to undergo this sizing-up procedure of 4 nm, these members are moved back to their original status. In the meantime, because still at lease one of the all members 211, 212, 213, 214, 221, 222, 223, 224, 231, 232, 233, 234 do not pass the test, the members which do not pass the test, i.e. member 211, 222, 223 and 234 still remain disqualified and are ready for a next round of sizing-up procedure.

Figure 5:
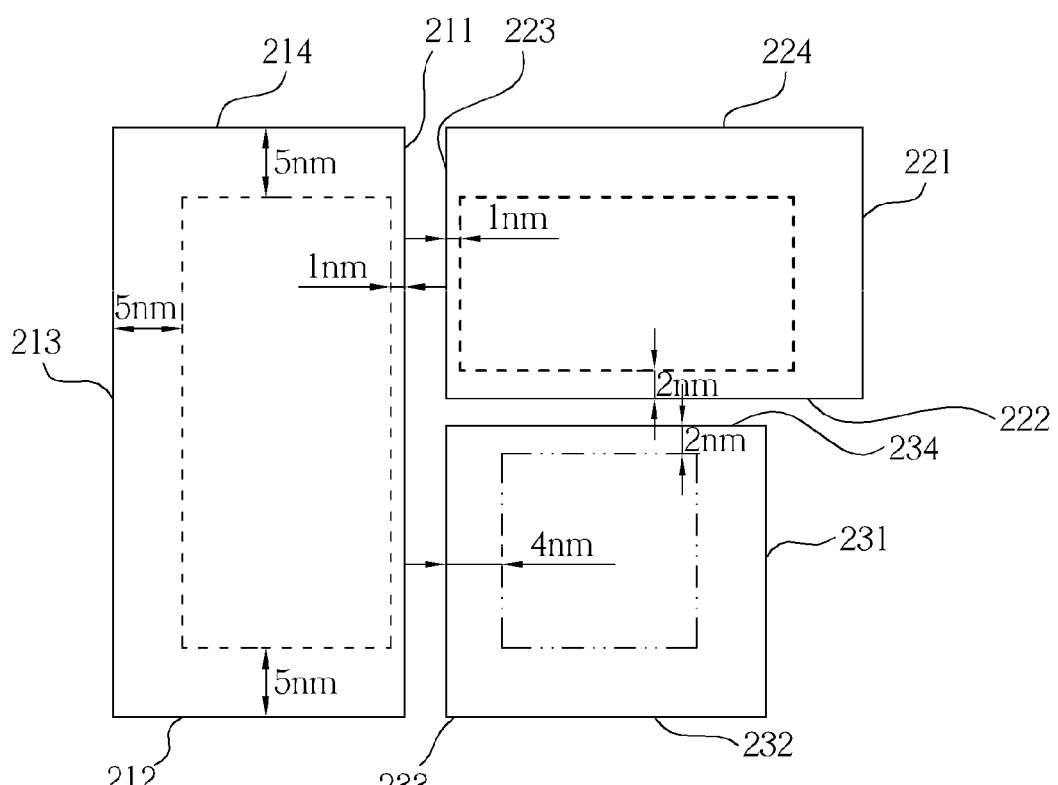
FIG. 5 illustrates a result after a sizing-up procedure.

In the next round of sizing-up procedure, the disqualified members 211, 222, 223 and 234 are again moved outward by a still next largest value 3 nm. Similar operations are performed over and over again till the bias moves down to 0 and sooner or later each one of the disqualified members passes the test. Assuming that the member 222 and the member 234 are allowed to undergo the sizing-up procedure of 2 nm but the member 211 and the member 233 are merely allowed to undergo the sizing-up procedure of 1 nm, the results are illustrated in FIG. 5. In the meantime, besides all of the members which pass the sizing-up operation keep the current bias, the current sized-up patterns are considered to be "usable". The usable sized-up patterns are considered to be the so-called final sized-up patterns and are ready to go to the following Step 140.

As a consequence, the above-mentioned

Figure 6:
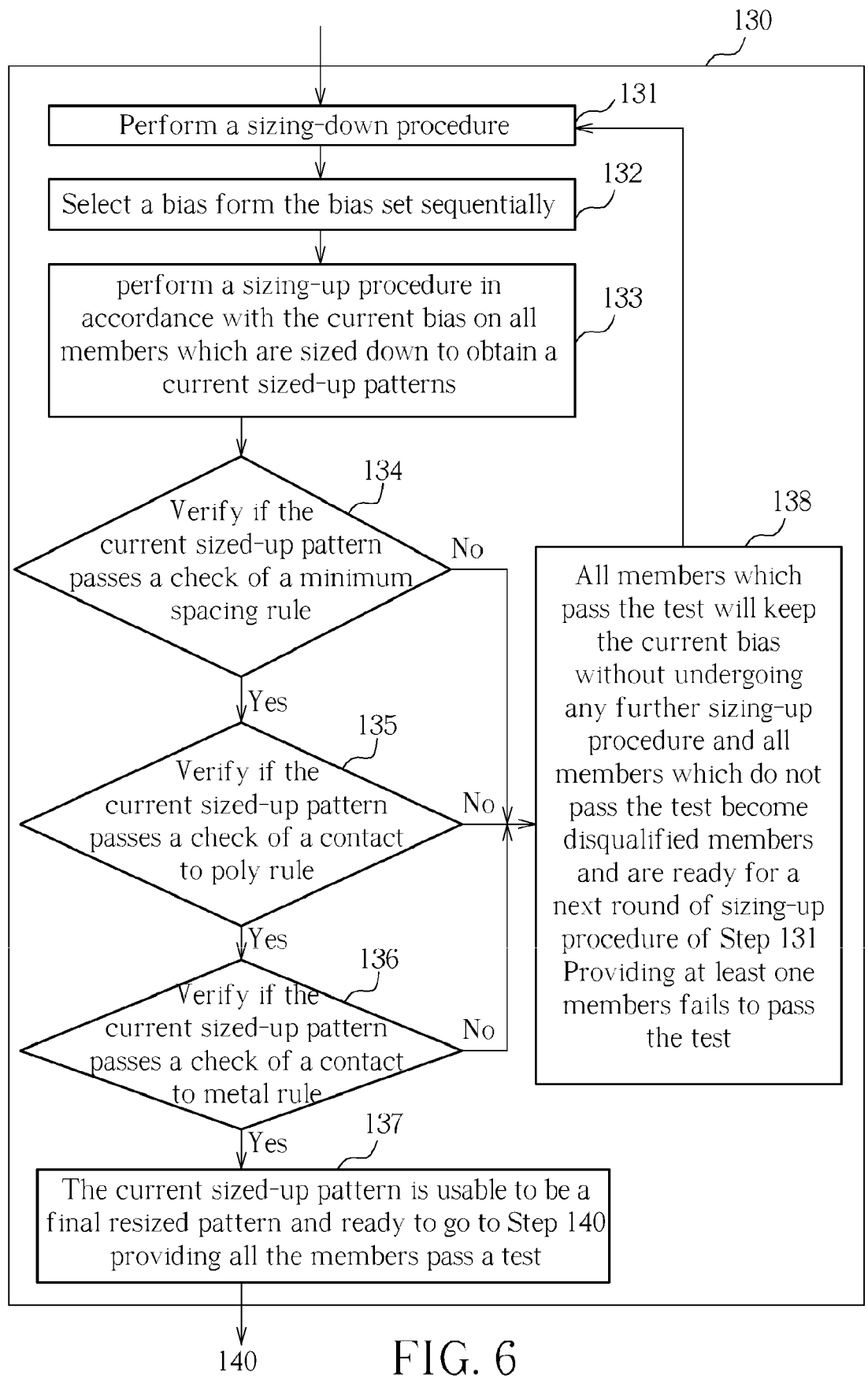
FIG. 6 illustrates the sub-steps of Step 130.

Step 130: obtain a usable final resized pattern by repeatedly carrying out a resizing procedure on the pattern data in accordance with the determined bias set may be divided into the following sub-steps as shown in FIG. 6:

Step 131: perform a sizing-down procedure;

Step 132: select a bias form the bias set sequentially;

Step 133: perform a sizing-up procedure in accordance with the current bias on all members which are sized down to obtain a current sized-up patterns;

Step 134: verify if the current sized-up pattern passes a check of a minimum spacing rule;

Step 135: verify if the current sized-up pattern passes a check of a contact to poly rule;

Step 136: verify if the current sized-up pattern passes a check of a contact to metal rule;

Step 137: the current sized-up pattern is usable to be a final resized pattern and ready to go to Step 140 providing all the members pass a test;

Step 138: all members which pass the test will keep the current bias without undergoing any further sizing-up procedure and all members which do not pass the test become disqualified members and are ready for a next round of sizing-up procedure of Step 131 providing at least one members fails to pass the test.

Then, the

Figure 7:
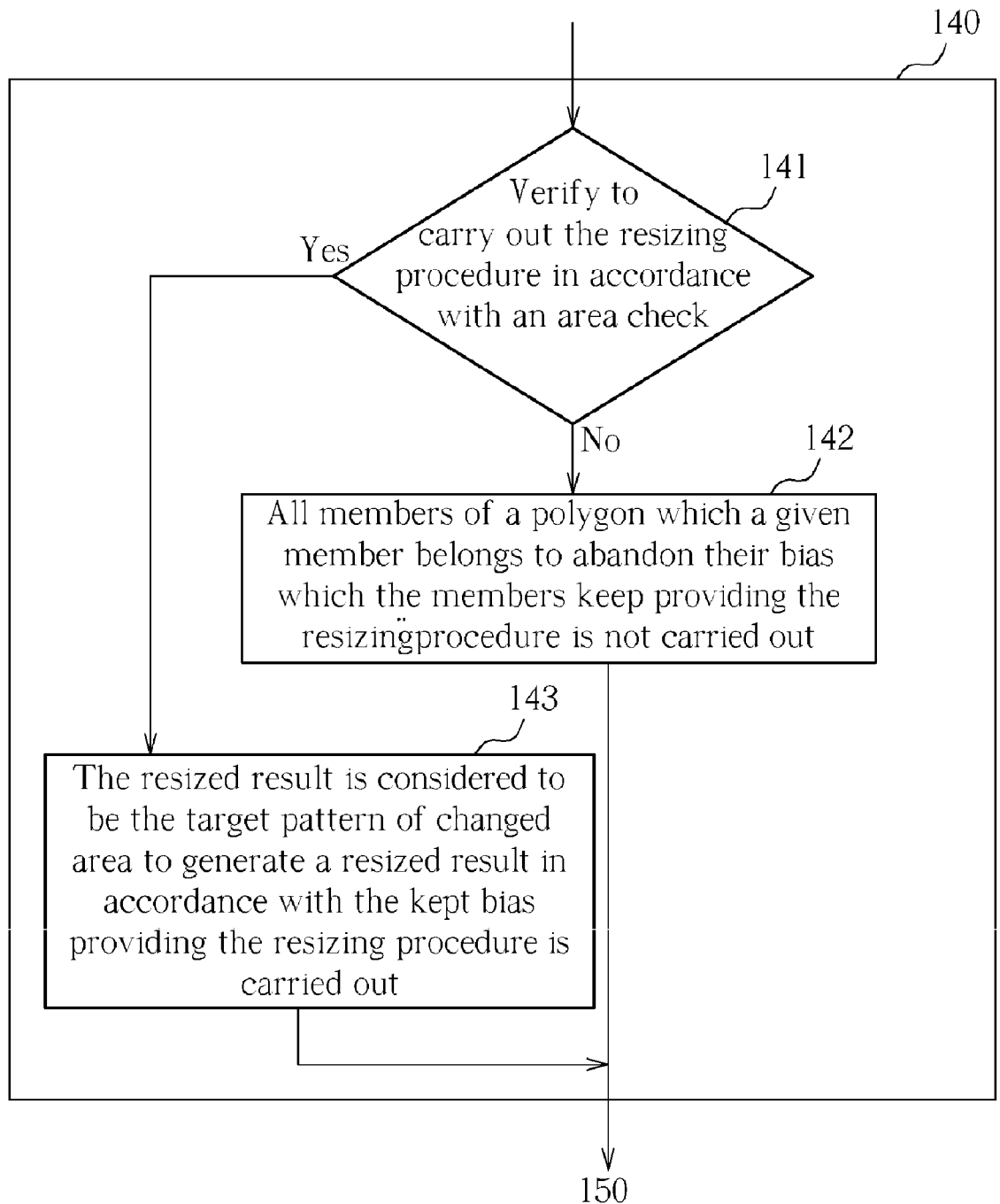
FIG. 7 illustrates the sub-steps of Step 140.

Step 140: perform an area check on the final resized pattern to obtain a target pattern of changed area is carried out to output the target pattern. Step 140 may be divided into the following sub-steps as shown in FIG. 7:

Step 141: verify to carry out the resizing procedure in accordance with an area check;

Step 142: all members of a polygon which a given member belongs to abandon their bias which the members keep providing the resizing procedure is not carried out;

Step 143: the resized result is considered to be the target pattern of changed area to generate a resized result in accordance with the kept bias providing the resizing procedure is carried out.

The Step 141 is useful in assuring if the resizing procedure is proper to avoid a "sizing-up procedure with smaller area". If improper, the resizing procedure is not carried out. The process to resize is carried out by the area check in Step 141. Because the larger the area of the elements is the better the performance is, the resizing procedure does not make the area smaller than its original area. In other words, the area A', B' and C' of the layout pattern 210, 220 and 230 after the sizing-down procedure should not be smaller than the original area size A, B and C.

For example, assuming that in a 70 nm by 70 nm rectangle three out of four edges may be moved outward by 1 nm but one edge must move inward 3 nm to meet the minimum spacing rule, the rectangle should abandon the resizing procedure as well as the kept bias to return its original dimension (70*70) because the original area size (70*70=4900) is larger than the resized area size [(70+1+1)*(70+1−3)=4896]. Some rectangles may have change in shape and get larger as well as some rectangles may have no change in shape and stay the same. However, no rectangle may have change in shape but get smaller at the same time.

Figure 8:
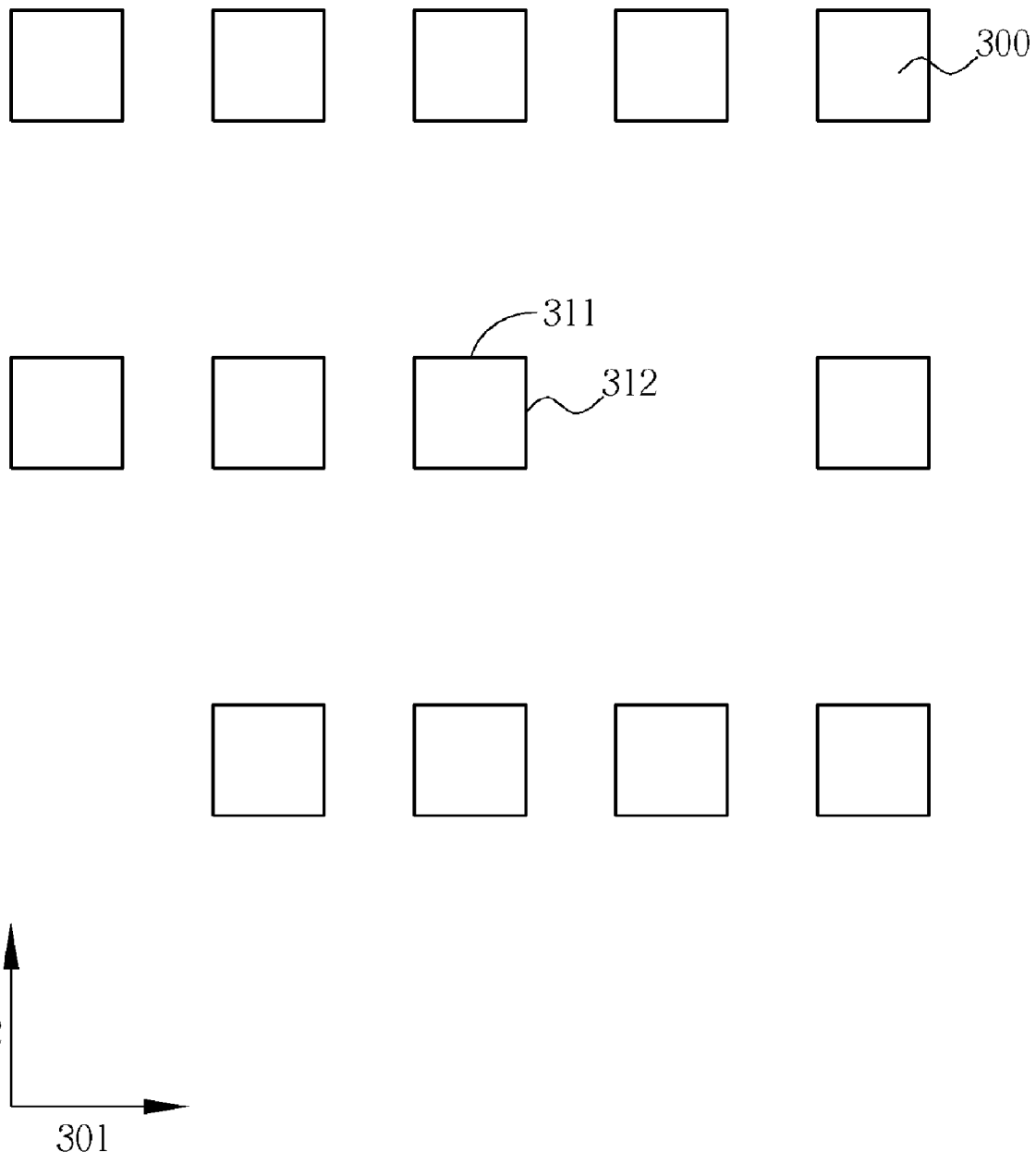
FIG. 8 illustrates layout patterns corresponding to elements in a particular given pattern data.

FIG. 8 illustrates layout patterns corresponding to elements in a particular given pattern data. FIG. 8 illustrates that the pattern data is composed of asymmetric layout patterns 300. In FIG. 8, the layout patterns 300 form the pattern data horizontally (in horizontal direction 301) and vertically 302 (in vertical direction 302). A layout pattern 300 has a first edge 311 along the horizontal direction 301 and a second edge 312 along the vertical direction 302. It is clearly observed in FIG. 8 that the horizontal space is by far less than the vertical space of the layout patterns 300.

If in the resizing procedure the first edge 311 along the horizontal direction 301 is enlarged, the already not spacious horizontal direction 301 becomes more crowded and "pitch" or "bridge" may possibly happen, which may adversely affect the pattern data. Accordingly, in the resizing procedure it is recommended that the area of the elements is enlarged by enlarging the second edge 312 along the vertical direction 302. Because the vertical space of the layout patterns 300 is much more adequate than the horizontal space of the layout patterns 300, more space is available for the resizing procedure. In such a way, it is on one hand advantageous for the increase of the elements and on the other hand avoids defects such as "pitch" or "bridge".

If the pattern data of the present invention from a design house are contact hole pattern data, the polygons representing the contact hole patterns, i.e. the rectangles, should have larger area. It is known that inadequate area size results in that the exposure energy fails to reach a minimum value and the pattern fails to be exposed. Accordingly, on one side, the larger the area is, the stronger the exposure intensity is and it is more possible to obtain a successful exposure pattern. On the other side, the larger the area is, the smaller the electrical resistance is and it is advantageous to the operational performance of the elements. Further, the larger the contact hole is, the wider the landing area is and it is advantageous to the process window. The method of the present invention brings forth the advantageous results which can not be achieved by the conventional optical proximity correction procedure.

After a useful target pattern is obtained by the method of the present invention, the useful target pattern can be output. The method of the present invention goes to Step 150: further perform a conventional optical proximity correction (OPC) procedure, and a following Step 160: perform a conventional optical proximity correction (OPC) verification. The conventional optical proximity correction procedure and the conventional optical proximity correction (OPC) verification may include a Boolean pretreatment, a design rule check (DRC), a lithography rule check (LRC), a model-based OPC process and a rule-based OPC process. The conventional optical proximity correction procedure and the conventional optical proximity correction (OPC) verification are well known by persons of ordinary skills in the art and the details will not be discussed.

Those skilled in the art will readily observe that numerous modifications and alterations of the device and method may be made while retaining the teachings of the invention.

What is claimed is:

1. A method to determine a process window, comprising:
   providing a pattern data, said pattern data comprising a plurality of polygons, said polygons comprising a plurality of members and each of said members being an edge of said polygons and each of said polygons having a first area;
   determining a bias set which is a collective of operational parameters for use in determining a process window;
   performing a resizing procedure on said pattern data by using a computer in accordance with said bias set to obtain a usable final resized pattern to be a target pattern of changed area, wherein said final resized pattern is consistent with a minimum spacing rule, and said resizing procedure comprises selecting a maximum value from said bias set, wherein said resizing procedure further comprises:
   performing a sizing-down procedure on all said members;
   performing a sizing-up procedure on all said members which are not sized down in accordance with said maximum value to obtain a first sized-up pattern; and
   verifying if said first sized-up pattern is usable to obtain said final resized pattern; and
   outputting said target pattern.

2. The method of claim 1, wherein said polygons comprise a rectangle.

3. The method of claim 1, wherein said pattern data is selected from a group consisting of contact hole pattern data and metal line pattern data.

4. The method of claim 1, wherein said resizing procedure further comprises:
   forming an assist feature.

5. The method of claim 1, wherein verifying if said first sized-up pattern is usable comprises:
   performing a test of said minimum spacing rule on all said members in said first sized-up pattern to verify if said first sized-up pattern is usable.

6. The method of claim 5, further comprising:
   deciding said usable first sized-up pattern to be said final resized pattern providing all said members pass said test of said minimum spacing rule.

7. The method of claim 5, further comprising:
   deciding all said members which pass said test of said minimum spacing rule o keep said maximum value without undergoing any further sizing-up procedure providing at least one said members fails to pass said test of said minimum spacing rule and all said members which fail to pass said test to be disqualified members to undergo a next sizing-up procedure.

8. The method of claim 7, wherein said next sizing-up procedure comprises:
selecting a next maximum value from said bias set;
performing said sizing-up procedure on all said disqualified members in accordance with said next maximum value to obtain a next sized-up pattern; and
verifying if all said disqualified members pass said test.

9. The method of claim 8, further comprising:
deciding all said disqualified members which pass said test of said minimum spacing rule to keep said next maximum value without undergoing any further sizing-up procedure providing at least one of said disqualified members passes said test.

10. The method of claim 8, further comprising:
deciding said disqualified member which fails to pass said test of said minimum spacing rule to continue to undergo still a next sizing-up procedure using a sizing value which is a next value of a current sizing value all the way to 0 from said bias set and to keep said next value till said disqualified member passes said test of said minimum spacing rule providing at least one of said disqualified members fails to pass said test of said minimum spacing rule; and
obtaining said first sized-up pattern.

11. The method of claim 1, wherein performing said sizing-down procedure comprises:
verifying if all said members are sized down in accordance with said minimum spacing rule.

12. The method of claim 11, further comprising:
deciding said member not sized down providing said member meets said minimum spacing rule.

13. The method of claim 11, further comprising:
deciding said member sized down providing said member fails to meet said minimum spacing rule.

14. The method of claim 13, further comprising:
deciding all of said members of said polygon to which said member belongs to abandon said bias which said members keep from said bias set providing said first area is greater than a second area which has undergone said resizing procedure.

15. The method of claim 11, further comprising:
carrying out said resizing procedure providing said first area is not greater than a second area which has undergone said resizing procedure.

16. The method of claim 1, further comprising:
outputting said target pattern to undergo an optical proximity correction procedure.

17. The method of claim 16, further comprising:
performing an optical proximity correction verification.

\* \* \* \* \*